United States Patent
Lee

(10) Patent No.: US 10,003,326 B1
(45) Date of Patent: Jun. 19, 2018

(54) RING OSCILLATOR

(71) Applicant: Shanghai Zhaoxin Semiconductor Co., Ltd., Shanghai (CN)

(72) Inventor: Yeong-Sheng Lee, Fremont, CA (US)

(73) Assignee: SHANGHAI ZHAOXIN SEMICONDUCTOR CO., LTD., Shanghai (CN)

( * ) Notice: Subject to any disclaimer, the term of this patent is extended or adjusted under 35 U.S.C. 154(b) by 0 days. days.

(21) Appl. No.: 15/863,601

(22) Filed: Jan. 5, 2018

Related U.S. Application Data

(63) Continuation-in-part of application No. 15/594,852, filed on May 15, 2017, now Pat. No. 9,900,008.

(51) Int. Cl.
*H03K 17/16* (2006.01)
*H03K 3/03* (2006.01)
*H02M 3/07* (2006.01)

(52) U.S. Cl.
CPC .......... *H03K 3/0315* (2013.01); *H02M 3/073* (2013.01)

(58) Field of Classification Search
CPC .............................. H03K 3/0315; H02M 3/073
USPC .......................................................... 326/83
See application file for complete search history.

(56) References Cited

U.S. PATENT DOCUMENTS

| | | | | |
|---|---|---|---|---|
| 5,561,399 A * | 10/1996 | Haartsen | ............... | H03B 5/1231 331/117 R |
| 5,764,111 A * | 6/1998 | Bushman | ............. | H03K 3/0315 331/1 A |
| 5,936,879 A | 8/1999 | Brouwer | | |
| 6,310,505 B1 | 10/2001 | Ogawa | | |
| 2002/0021159 A1 | 2/2002 | Takahashi | | |
| 2007/0013454 A1* | 1/2007 | Ji | ............... | H03K 3/017 331/57 |
| 2007/0018737 A1* | 1/2007 | Drake | .................. | H03K 3/012 331/57 |
| 2011/0053548 A1* | 3/2011 | Kondou | ............... | H03K 3/0315 455/334 |
| 2011/0084743 A1 | 4/2011 | Chen | | |
| 2014/0327486 A1* | 11/2014 | Roine | .................. | H03B 5/24 331/108 C |
| 2017/0104455 A1* | 4/2017 | Tohidian | ............... | H03B 27/00 |
| 2018/0091094 A1* | 3/2018 | La Rosa | ............... | G11C 7/062 |

* cited by examiner

*Primary Examiner* — Don Le
(74) *Attorney, Agent, or Firm* — McClure, Qualey & Rodack, LLP

(57) ABSTRACT

A pre-driver includes a first inverter, a second inverter, a third inverter, a first amplifier, a second amplifier, a third amplifier, a first capacitor, a second capacitor, and a third capacitor. The first inverter has an input terminal coupled to an output node, and an output terminal coupled to a first node. The second inverter has an input terminal coupled to the first node, and an output terminal coupled to a second node. The third inverter has an input terminal coupled to the second node, and an output terminal coupled to the output node. The output node is further coupled through the first amplifier and the first capacitor to the first node. The first node is further coupled through the second amplifier and the second capacitor to the second node. The second node is further coupled through the third amplifier and the third capacitor to the output node.

20 Claims, 10 Drawing Sheets

US 10,003,326 B1

RING OSCILLATOR

CROSS REFERENCE TO RELATED APPLICATIONS

This application is a Continuation-In-Part of application Ser. No. 15/594,852, filed May 15, 2017, the entirety of which is incorporated by reference herein.

BACKGROUND OF THE INVENTION

Field of the Invention

The disclosure generally relates to a ring oscillator, and more specifically, to a ring oscillator with a very high oscillation frequency.

Description of the Related Art

For recent high-speed communication, jitter performance depends on short rising/falling time of clock signals. However, wiring and gate layout contributes a large parasitic capacitance, and it may increase the rising/falling time and limit the transmission speed of circuitry. Some prior documents use an inductor coupled in parallel with the parasitic capacitor, but these designs can only cover a narrow frequency range. Accordingly, there is a need to propose a novel solution for solving the problems of the prior art.

BRIEF SUMMARY OF THE INVENTION

In a preferred embodiment, the invention is directed to a ring oscillator including a first inverter, a second inverter, a third inverter, a first amplifier, a second amplifier, a third amplifier, a first capacitor, a second capacitor, and a third capacitor. The first inverter has an input terminal for receiving an output signal, and an output terminal for outputting a first signal at a first node. The second inverter has an input terminal for receiving the first signal, and an output terminal for outputting a second signal at a second node. The third inverter has an input terminal for receiving the second signal, and an output terminal for outputting the output signal at an output node of the ring oscillator. The first amplifier amplifies the output signal by a gain factor so as to generate a first amplified signal. The second amplifier amplifies the first signal by the gain factor so as to generate a second amplified signal. The third amplifier amplifies the second signal by the gain factor so as to generate a third amplified signal. The first capacitor has a first terminal coupled to the first node, and a second terminal for receiving the third amplified signal. The second capacitor has a first terminal coupled to the second node, and a second terminal for receiving the first amplified signal. The third capacitor has a first terminal coupled to the output node, and a second terminal for receiving the second amplified signal.

In some embodiments, the capacitance of the first capacitor is substantially equal to the total parasitic capacitance at the first node. The capacitance of the second capacitor is substantially equal to the total parasitic capacitance at the second node. The capacitance of the third capacitor is substantially equal to the total parasitic capacitance at the output node.

In some embodiments, the gain factor is substantially equal to 2.

In some embodiments, the first amplifier, the second amplifier, and the third amplifier are supplied by a tunable supply voltage and a fixed supply voltage. The gain factor is determined according to the tunable supply voltage.

In some embodiments, each of the first amplifier, the second amplifier, and the third amplifier includes: a first N-type transistor, wherein the first N-type transistor has a control terminal coupled to an amplifier input node, a first terminal coupled to a ground voltage, and a second terminal coupled to a third node, and wherein the amplifier input node is arranged for receiving the output signal, the first signal, or the second signal; a first P-type transistor, wherein the first P-type transistor has a control terminal coupled to the third node, a first terminal coupled to the tunable supply voltage, and a second terminal coupled to the third node; a second P-type transistor, wherein the second P-type transistor has a control terminal coupled to the third node, a first terminal coupled to the tunable supply voltage, and a second terminal coupled to an amplifier output node, and wherein the amplifier output node is arranged for outputting the first amplified signal, the second amplified signal, or the third amplified signal; a third P-type transistor, wherein the third P-type transistor has a control terminal coupled to the amplifier input node, a first terminal coupled to the fixed supply voltage, and a second terminal coupled to a fourth node; a second N-type transistor, wherein the second N-type transistor has a control terminal coupled to the fourth node, a first terminal coupled to the ground voltage, and a second terminal coupled to the fourth node; and a third N-type transistor, wherein the third N-type transistor has a control terminal coupled to the fourth node, a first terminal coupled to the ground voltage, and a second terminal coupled to the amplifier output node.

In some embodiments, the ring oscillator further includes: a regulator, supplied by an independent supply voltage, wherein the regulator generates the tunable supply voltage which is determined according to a reference voltage.

In some embodiments, the regulator includes: a fourth P-type transistor, wherein the fourth P-type transistor has a control terminal coupled to a fifth node, a first terminal coupled to the independent supply voltage, and a second terminal coupled to the fifth node; a fifth P-type transistor, wherein the fifth P-type transistor has a control terminal coupled to the fifth node, a first terminal coupled to the independent supply voltage, and a second terminal coupled to a sixth node; a sixth P-type transistor, wherein the sixth P-type transistor has a control terminal coupled to the sixth node, a first terminal coupled to the independent supply voltage, and a second terminal coupled to a regulator output node, and wherein the regulator output node is arranged for outputting the tunable supply voltage; a fourth N-type transistor, wherein the fourth N-type transistor has a control terminal coupled to a seventh node, a first terminal coupled to an eighth node, and a second terminal coupled to the fifth node; a fifth N-type transistor, wherein the fifth N-type transistor has a control terminal coupled to a regulator input node, a first terminal coupled to the eighth node, and a second terminal coupled to the sixth node, and wherein the regulator input node is arranged for receiving the reference voltage; an independent current sink, drawing a current from the eighth node to a ground voltage; a first resistor, wherein the first resistor has a first terminal coupled to the regulator output node, and a second terminal coupled to the seventh node; and a second resistor, wherein the second resistor has a first terminal coupled to the seventh node, and a second terminal coupled to the ground voltage.

In some embodiments, the ring oscillator further includes: a voltage simulator, using the fixed supply voltage and one of the first signal, the second signal, and the output signal to generate the independent supply voltage, wherein the independent supply voltage is higher than the fixed supply voltage.

In some embodiments, the voltage simulator includes: a frequency divider, dividing a frequency of one of the first signal, the second signal, and the output signal by a division factor so as to generate a control signal and an inverted control signal; and a switched-capacitor voltage tripler, generating the independent supply voltage according to the fixed supply voltage and the control signal and the inverted control signal, wherein the independent supply voltage is substantially three times the fixed supply voltage.

In some embodiments, the switched-capacitor voltage tripler includes: a first switch element, selectively closed or opened according to the control signal, wherein the first switch element has a first terminal coupled to a tripler input node, and a second terminal coupled to a ninth node, wherein the tripler input node is arranged for receiving the fixed supply voltage; a fourth capacitor, wherein the fourth capacitor has a first terminal coupled to the ninth node, and a second terminal coupled to a tenth node; a second switch element, selectively closed or opened according to the control signal, wherein the second switch element has a first terminal coupled to a ground voltage, and a second terminal coupled to the tenth node; a third switch element, selectively closed or opened according to the control signal, wherein the third switch element has a first terminal coupled to the tripler input node, and a second terminal coupled to an eleventh node; a fifth capacitor, wherein the fifth capacitor has a first terminal coupled to the eleventh node, and a second terminal coupled to a twelfth node; a fourth switch element, selectively closed or opened according to the control signal, wherein the fourth switch element has a first terminal coupled to the ground voltage, and a second terminal coupled to the twelfth node; a fifth switch element, selectively closed or opened according to the inverted control signal, wherein the fifth switch element has a first terminal coupled to the ninth node, and a second terminal coupled to a tripler output node, wherein the tripler output node is arranged for outputting the independent supply voltage; a sixth capacitor, wherein the sixth capacitor has a first terminal coupled to the tripler output node, and a second terminal coupled to the ground voltage; a sixth switch element, selectively closed or opened according to the inverted control signal, wherein the sixth switch element has a first terminal coupled to the tenth node, and a second terminal coupled to the eleventh node; and a seventh switch element, selectively closed or opened according to the inverted control signal, wherein the seventh switch element has a first terminal coupled to the twelfth node, and a second terminal coupled to the tripler input node.

In another preferred embodiment, the invention is directed to a ring oscillator including: a first inverter, wherein the first inverter has an input terminal for receiving an output signal, and an output terminal for outputting a first signal at a first node; a second inverter, wherein the second inverter has an input terminal for receiving the first signal, and an output terminal for outputting a second signal at a second node; a third inverter, wherein the third inverter has an input terminal for receiving the second signal, and an output terminal for outputting the output signal at an output node of the ring oscillator; a first amplifier, amplifying the output signal by a gain factor so as to generate a first amplified signal; a second amplifier, amplifying the first signal by the gain factor so as to generate a second amplified signal; a third amplifier, amplifying the second signal by the gain factor so as to generate a third amplified signal; a first capacitor, wherein the first capacitor has a first terminal coupled to the first node, and a second terminal for receiving the first amplified signal; a second capacitor, wherein the second capacitor has a first terminal coupled to the second node, and a second terminal for receiving the second amplified signal; and a third capacitor, wherein the third capacitor has a first terminal coupled to the output node, and a second terminal for receiving the third amplified signal.

In some embodiments, a capacitance of the first capacitor is substantially equal to a total parasitic capacitance at the first node, wherein a capacitance of the second capacitor is substantially equal to a total parasitic capacitance at the second node, and wherein a capacitance of the third capacitor is substantially equal to a total parasitic capacitance at the output node.

In some embodiments, the first inverter, the second inverter, and the third inverter are supplied by a fixed supply voltage, wherein the first amplifier, the second amplifier, and the third amplifier are supplied by a tunable supply voltage, and wherein the gain factor is determined according to the tunable supply voltage.

In some embodiments, each of the first amplifier, the second amplifier, and the third amplifier includes: a first P-type transistor, wherein the first P-type transistor has a control terminal coupled to a third node, a first terminal coupled to the tunable supply voltage, and a second terminal coupled to an amplifier output node, wherein the amplifier output node is arranged for outputting the first amplified signal, the second amplified signal, or the third amplified signal; a first N-type transistor, wherein the first N-type transistor has a control terminal coupled to an amplifier input node, a first terminal coupled to a ground voltage, and a second terminal coupled to the amplifier output node, wherein the amplifier input node is arranged for receiving the output signal, the first signal, or the second signal; and a level shifter, coupled between the amplifier input node and the third node, such that a voltage at the third node is higher than a voltage at the amplifier input node.

In some embodiments, the level shifter includes: a second P-type transistor, wherein the second P-type transistor has a control terminal coupled to the fixed supply voltage, a first terminal coupled to the tunable supply voltage, and a second terminal coupled to the third node; and a third P-type transistor, wherein the third P-type transistor has a control terminal coupled to the amplifier input node, a first terminal coupled to the third node, and a second terminal coupled to the ground voltage.

In some embodiments, the ring oscillator further includes: a regulator, supplied by an independent supply voltage, wherein the regulator generates the tunable supply voltage which is determined according to a reference voltage.

In some embodiments, the regulator includes: a fourth P-type transistor, wherein the fourth P-type transistor has a control terminal coupled to a fifth node, a first terminal coupled to the independent supply voltage, and a second terminal coupled to the fifth node; a fifth P-type transistor, wherein the fifth P-type transistor has a control terminal coupled to the fifth node, a first terminal coupled to the independent supply voltage, and a second terminal coupled to a sixth node; a sixth P-type transistor, wherein the sixth P-type transistor has a control terminal coupled to the sixth node, a first terminal coupled to the independent supply voltage, and a second terminal coupled to a regulator output node, and wherein the regulator output node is arranged for outputting the tunable supply voltage; a fourth N-type transistor, wherein the fourth N-type transistor has a control terminal coupled to a seventh node, a first terminal coupled to an eighth node, and a second terminal coupled to the fifth node; a fifth N-type transistor, wherein the fifth N-type transistor has a control terminal coupled to a regulator input node, a first terminal coupled to the eighth node, and a second terminal coupled to the sixth node, and wherein the regulator input node is arranged for receiving the reference voltage; an independent current sink, drawing a current from the eighth node to a ground voltage; a first resistor, wherein the first resistor has a first terminal coupled to the regulator output node, and a second terminal coupled to the seventh node; and a second resistor, wherein the second resistor has a first terminal coupled to the seventh node, and a second terminal coupled to the ground voltage.

In some embodiments, the ring oscillator further includes: a voltage simulator, using the fixed supply voltage and one of the first signal, the second signal, and the output signal to generate the independent supply voltage, wherein the independent supply voltage is higher than the fixed supply voltage.

In some embodiments, the voltage simulator includes: a frequency divider, dividing a frequency of one of the first signal, the second signal, and the output signal by a division factor so as to generate a control signal and an inverted control signal; and a switched-capacitor voltage tripler, generating the independent supply voltage according to the fixed supply voltage and the control signal and the inverted control signal, wherein the independent supply voltage is substantially three times the fixed supply voltage.

In some embodiments, the switched-capacitor voltage tripler includes: a first switch element, selectively closed or opened according to the control signal, wherein the first switch element has a first terminal coupled to a tripler input node, and a second terminal coupled to a ninth node, wherein the tripler input node is arranged for receiving the fixed supply voltage; a fourth capacitor, wherein the fourth capacitor has a first terminal coupled to the ninth node, and a second terminal coupled to a tenth node; a second switch element, selectively closed or opened according to the control signal, wherein the second switch element has a first terminal coupled to a ground voltage, and a second terminal coupled to the tenth node; a third switch element, selectively closed or opened according to the control signal, wherein the third switch element has a first terminal coupled to the tripler input node, and a second terminal coupled to an eleventh node; a fifth capacitor, wherein the fifth capacitor has a first terminal coupled to the eleventh node, and a second terminal coupled to a twelfth node; a fourth switch element, selectively closed or opened according to the control signal, wherein the fourth switch element has a first terminal coupled to the ground voltage, and a second terminal coupled to the twelfth node; a fifth switch element, selectively closed or opened according to the inverted control signal, wherein the fifth switch element has a first terminal coupled to the ninth node, and a second terminal coupled to a tripler output node, wherein the tripler output node is arranged for outputting the independent supply voltage; a sixth capacitor, wherein the fifth capacitor has a first terminal coupled to the tripler output node, and a second terminal coupled to the ground voltage; a sixth switch element, selectively closed or opened according to the inverted control signal, wherein the sixth switch element has a first terminal coupled to the tenth node, and a second terminal coupled to the eleventh node; and a seventh switch element, selectively closed or opened according to the inverted control signal, wherein the seventh switch element has a first terminal coupled to the twelfth node, and a second terminal coupled to the tripler input node.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are described in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

Figure 1A:
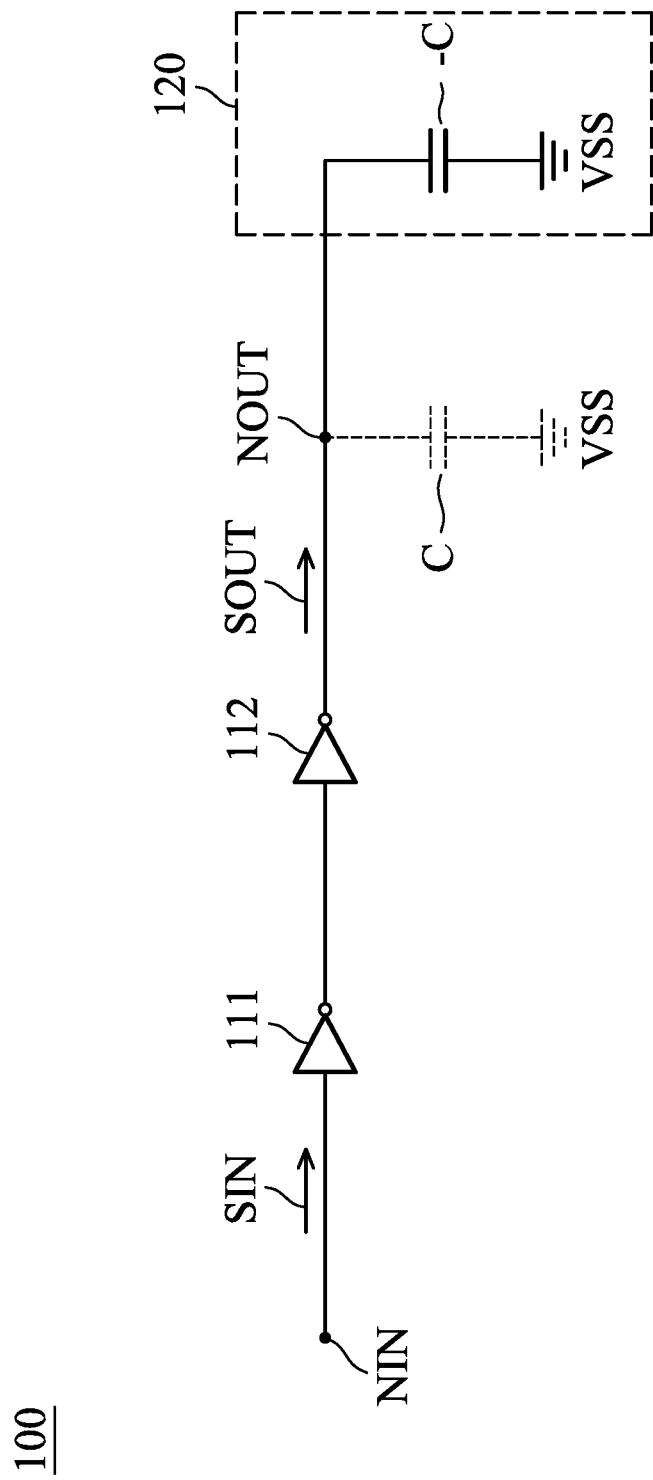
FIG. 1A is a diagram of a pre-driver according to an embodiment of the invention.

FIG. 1A is a diagram of a pre-driver 100 according to an embodiment of the invention. In the embodiment of FIG. 1A, the pre-driver 100 includes a first inverter 111 and a second inverter 112, which are coupled in series. The pre-driver 100 has an input node NIN for receiving an input signal SIN, and an output node NOUT for outputting an output signal SOUT according to the input signal SIN to drive a subsequent stage such as an output driver. By using the pre-driver 100, the output signal SOUT has a stronger capability for driving an output current. However, there is a parasitic capacitance at the output node NOUT, and it is modeled as a parasitic capacitor C coupled between the output node NOUT and a ground voltage VSS. The parasitic capacitor C may result from the wiring and gate layout of the pre-driver 100. Unfortunately, the parasitic capacitor C increases the rising/falling time of the output signal SOUT and reduces the transmission speed of the pre-driver 100. In order to solve this problem, the embodiment of FIG. 1 uses a negative capacitance mechanism 120 to compensate for the non-ideal parasitic capacitor C, and it is modeled as a negative capacitor −C coupled between the output node NOUT and the ground voltage VSS. With such a design, the transmission and operation speed of the pre-driver 100 is significantly improved because the parasitic capacitor C is cancelled by the parallel negative capacitor −C. Furthermore, the operation frequency range of the pre-driver 100 is not limited due to the negative capacitance mechanism 120.

Figure 1B:
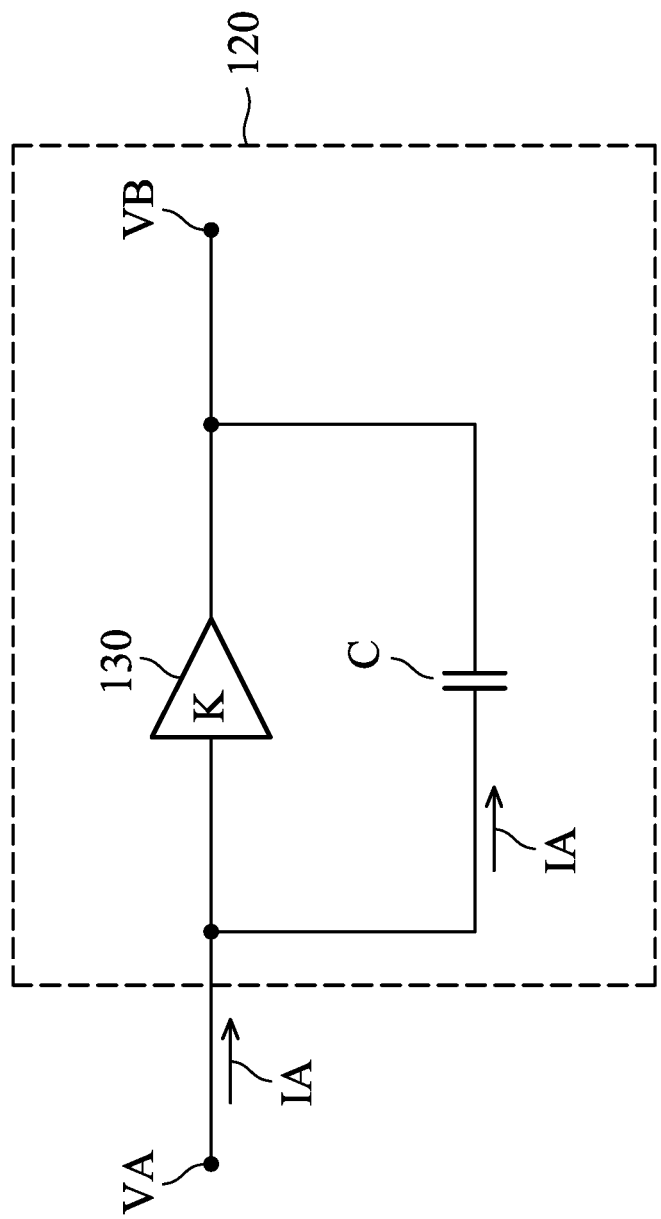
FIG. 1B is a diagram of a negative capacitance mechanism according to an embodiment of the invention.

FIG. 1B is a diagram of the negative capacitance mechanism 120 according to an embodiment of the invention. The embodiment of FIG. 1B describes a circuit solution to generate the negative capacitor −C. The negative capacitance mechanism 120 may be formed by a positive capacitor C and an amplifier 130. The amplifier 130 has a gain factor K, and it can amplify a first voltage VA by the gain factor K, so as to generate a second voltage VB. The positive capacitor C is coupled between the first voltage VA and the second voltage VB (i.e., between an input terminal and an output terminal of the amplifier 130). A current IA flows through the positive capacitor C. The effective impedance measured at the first voltage VA is calculated as the following equations (1) to (5).

$$IA = \frac{(VA - VB)}{\frac{1}{s \cdot C}} = (VA - VB) \cdot s \cdot C \quad (1)$$

$$VB = K \cdot VA \quad (2)$$

$$IA = (1 - K) \cdot VA \cdot s \cdot C \quad (3)$$

$$Z = \frac{VA}{IA} = \frac{1}{(1 - K) \cdot s \cdot C} \quad (4)$$

$$CE = (1 - K) \cdot C \quad (5)$$

where "VA" represents the voltage level of the first voltage VA, "VB" represents the voltage level of the second voltage VB, "C" represents the capacitance of the positive capacitor C, "K" represents the gain factor K of the amplifier 130, "s" represents the Laplace transform variable, "Z" represents the effective impedance measured at the first voltage VA, and "CE" represents the effective capacitance measured at the first voltage VA.

According to the equations (1) to (5), if the gain factor K is set to 2, the negative capacitor −C will be generated. The following embodiments will introduce the proposed design of the invention using the negative capacitance mechanism 120 to improve the transmission and operation speed of circuitry. It should be understood that these embodiments are merely exemplary, rather than restricted limitations of the invention.

Figure 2:
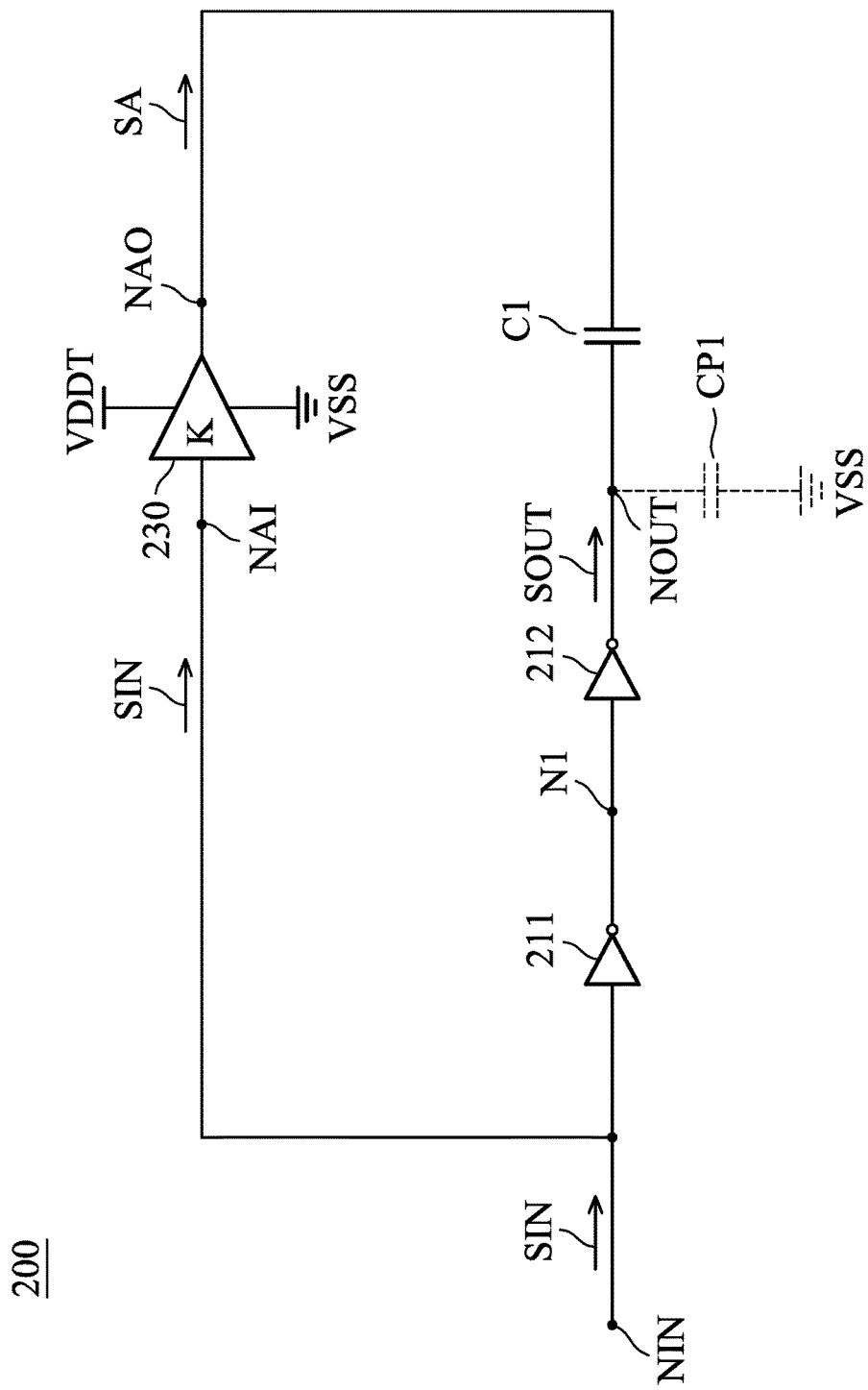
FIG. 2 is a diagram of a pre-driver according to an embodiment of the invention.

FIG. 2 is a diagram of a pre-driver 200 according to an embodiment of the invention. In the embodiment of FIG. 2, the pre-driver 200 with an input node NIN and an output node NOUT includes a first inverter 211, a second inverter 212, an amplifier 230, and a first capacitor C1. The first inverter 211 has an input terminal for receiving an input signal SIN at the input node NIN, and an output terminal coupled to a first node N1. The second inverter 212 has an input terminal coupled to the first node N1, and an output terminal for outputting an output signal SOUT at an output node NOUT to drive a subsequent stage such as an output driver. The input signal SIN and the output signal SOUT may both be data or clock signals with different rising times. The amplifier 230 can amplify the input signal SIN by a gain factor K, so as to generate an amplified signal SA. The first capacitor C1 has a first terminal coupled to the output node NOUT, and a second terminal for receiving the amplified signal SA.

The total parasitic capacitance at the output node NOUT is modeled as a first parasitic capacitor CP1. For example, the capacitance of the first capacitor C1 may be substantially equal to the capacitance of the first parasitic capacitor CP1, and the gain factor K of the amplifier 230 may be substantially equal to 2, such that the first parasitic capacitor CP1 can be cancelled by the first capacitor C1 using the aforementioned negative capacitance mechanism. Accordingly, the transmission and operation speed of the pre-driver 200 can be improved. It should be noted that the invention is not limited to the above. In some embodiments, the amplifier 230 is supplied by a tunable supply voltage VDDT and a fixed supply voltage, and the gain factor K of the amplifier 230 is determined and adjusted according to the tunable supply voltage VDDT. That is, the aforementioned negative capacitance mechanism may be tunable for a variety of circuit applications, so as to meet different requirements.

In addition to the pre-driver, the proposed negative capacitance mechanism may be also applied to a ring oscillator. An oscillation frequency of the ring oscillator can be significantly increased because the non-ideal parasitic capacitance is cancelled by the negative capacitance mechanism. Please refer to the following embodiments.

Figure 3:
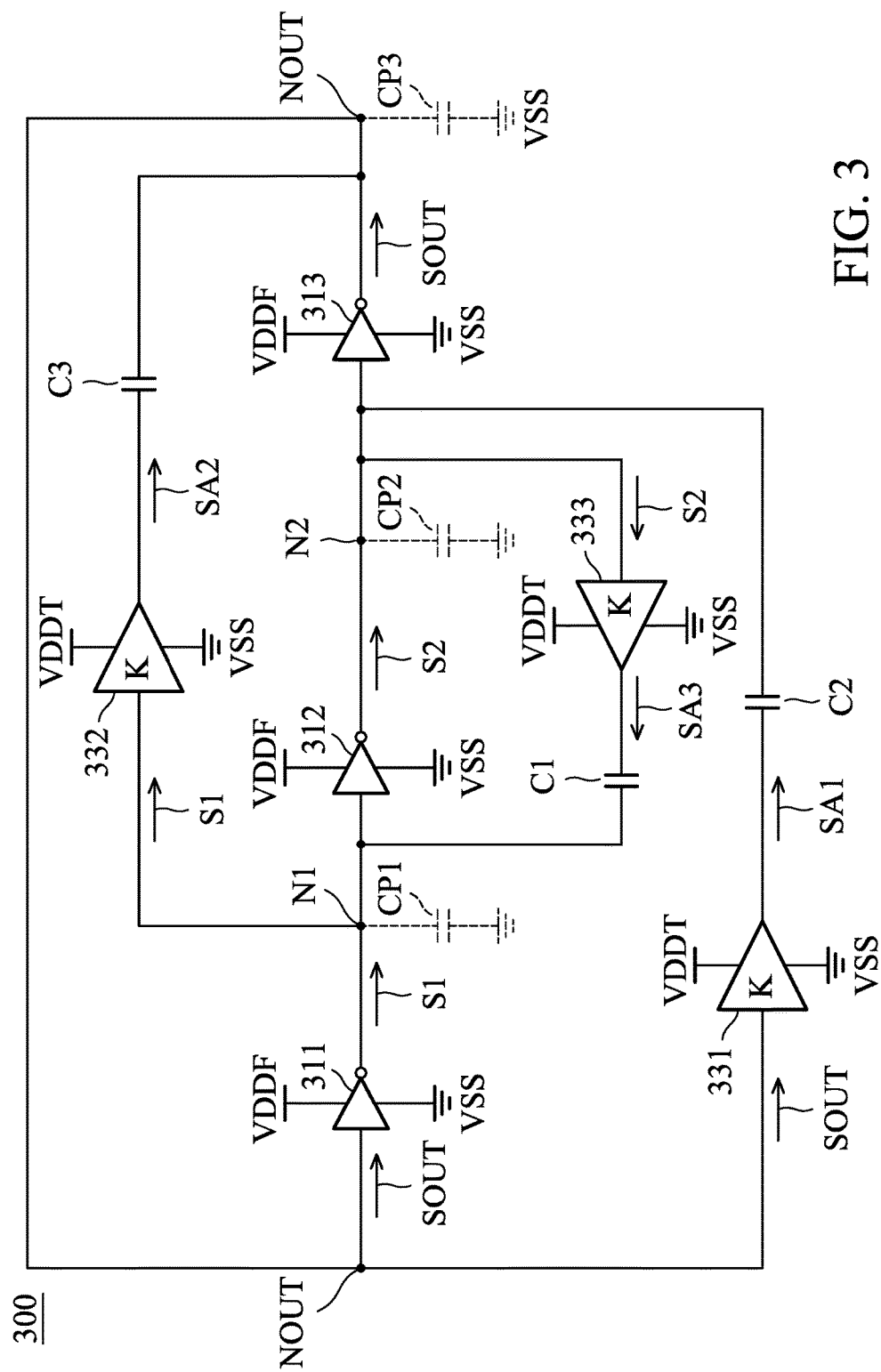
FIG. 3 is a diagram of a ring oscillator according to an embodiment of the invention.

FIG. 3 is a diagram of a ring oscillator 300 according to an embodiment of the invention. In the embodiment of FIG. 3, the ring oscillator 300 with an output node NOUT includes a first inverter 311, a second inverter 312, a third inverter 313, a first amplifier 331, a second amplifier 332, a third amplifier 333, a first capacitor C1, a second capacitor C2, and a third capacitor C3. The output node NOUT of the ring oscillator 300 is arranged for outputting an output signal SOUT, so as to drive a subsequent stage. The output signal SOUT may be a clock signal. The first inverter 311, the second inverter 312, and the third inverter 313 are supplied by a fixed supply voltage VDDF. The first inverter 311 has an input terminal coupled to the output node NOUT for receiving an output signal SOUT, and an output terminal for outputting a first signal S1 at a first node N1. The second inverter 312 has an input terminal coupled to the first node N1 for receiving the first signal S1, and an output terminal for outputting a second signal S2 at a second node N2. The third inverter 313 has an input terminal coupled to the second node N2 for receiving the second signal S2, and an output terminal for outputting the output signal SOUT at the output node NOUT. The first amplifier 331 can amplify the output signal SOUT by a gain factor K, so as to generate a first amplified signal SA1. The second amplifier 332 can amplify the first signal S1 by the gain factor K, so as to generate a second amplified signal SA2. The third amplifier 333 can amplify the second signal S2 by the gain factor K, so as to generate a third amplified signal SA3. The first capacitor C1 has a first terminal coupled to the first node N1, and a second terminal for receiving the third amplified signal SA3. The second capacitor C2 has a first terminal coupled to the second node N2, and a second terminal for receiving the first amplified signal SA1. The third capacitor C3 has a first terminal coupled to the output node NOUT, and a second terminal for receiving the second amplified signal SA2. The relationship between the above signals may be described by the following equations (6), (7), and (8).

$$SA1=K \cdot SOUT \quad (6)$$

$$SA2=K \cdot S1 \quad (7)$$

$$SA3=K \cdot S2 \quad (8)$$

where "SA1" represents the voltage level of the first amplified signal SA1, "SA2" represents the voltage level of the second amplified signal SA2, "SA3" represents the voltage level of the third amplified signal SA3, "K" represents the gain factor K of each of the first amplifier 331, the second amplifier 332, and the third amplifier 333, "SOUT" represents the voltage level of the output signal SOUT, "S1" represents the voltage level of the first signal S1, and "S2" represents the voltage level of the second signal S2. In some embodiments, the first inverter 311, the second inverter 312, and the third inverter 313 are CMOS (Complementary Metal Oxide Semiconductor) inverters, each of which includes a P-type transistor and an N-type transistor coupled between the fixed supply voltage VDDF and a ground voltage VSS. In some embodiments, the first inverter 311, the second inverter 312, and the third inverter 313 have the same size (i.e., the aspect ratios (W/L) of the CMOS transistors), and therefore these inverters have the same capability for driving currents.

The total parasitic capacitance at the first node N1 is modeled as a first parasitic capacitor CP1. The total parasitic capacitance at the second node N2 is modeled as a second parasitic capacitor CP2. The total parasitic capacitance at the output node NOUT is modeled as a third parasitic capacitor CP3. For example, the capacitance of the first capacitor C1 may be substantially equal to the capacitance of the first parasitic capacitor CP1, the capacitance of the second capacitor C2 may be substantially equal to the capacitance of the second parasitic capacitor CP2, the capacitance of the third capacitor C3 may be substantially equal to the capacitance of the third parasitic capacitor CP3, and the gain factor K of each of the first amplifier 331, the second amplifier 332, and the third amplifier 333 may be substantially equal to 2, such that the first parasitic capacitor CP1 can be cancelled by the first capacitor C1, the second parasitic capacitor CP2 can be cancelled by the second capacitor C2, and the third parasitic capacitor CP3 can be cancelled by the third capacitor C3, using the aforementioned negative capacitance mechanism. Compared with the embodiment of FIG. 2, the parasitic capacitance between any two cascading inverters is also considered and cancelled in the embodiment of FIG. 3. Such a design can further increase the oscillation frequency of the ring oscillator 300. It should be noted that the invention is not limited to the above. In some embodiments, the first amplifier 331, the second amplifier 332, and the third amplifier 333 are supplied by a tunable supply voltage VDDT and the fixed supply voltage VDDF. The tunable supply voltage VDDT may be higher than the fixed supply voltage VDDF. For example, the tunable supply voltage VDDT may be substantially from one to three times the fixed supply voltage VDDF. The gain factor K of each of the first amplifier 331, the second amplifier 332, and the third amplifier 333 may be determined and adjusted according to the tunable supply voltage VDDT. That is, the aforementioned negative capacitance mechanism may be tunable for a variety of circuit applications, so as to meet different requirements.

It should be understood that although there are exactly three inverters, three amplifiers, and three capacitors displayed in FIG. 3, the ring oscillator 300 may include more cascading circuit stages arranged in a similar way, without affecting the performance of the invention.

Figure 4:
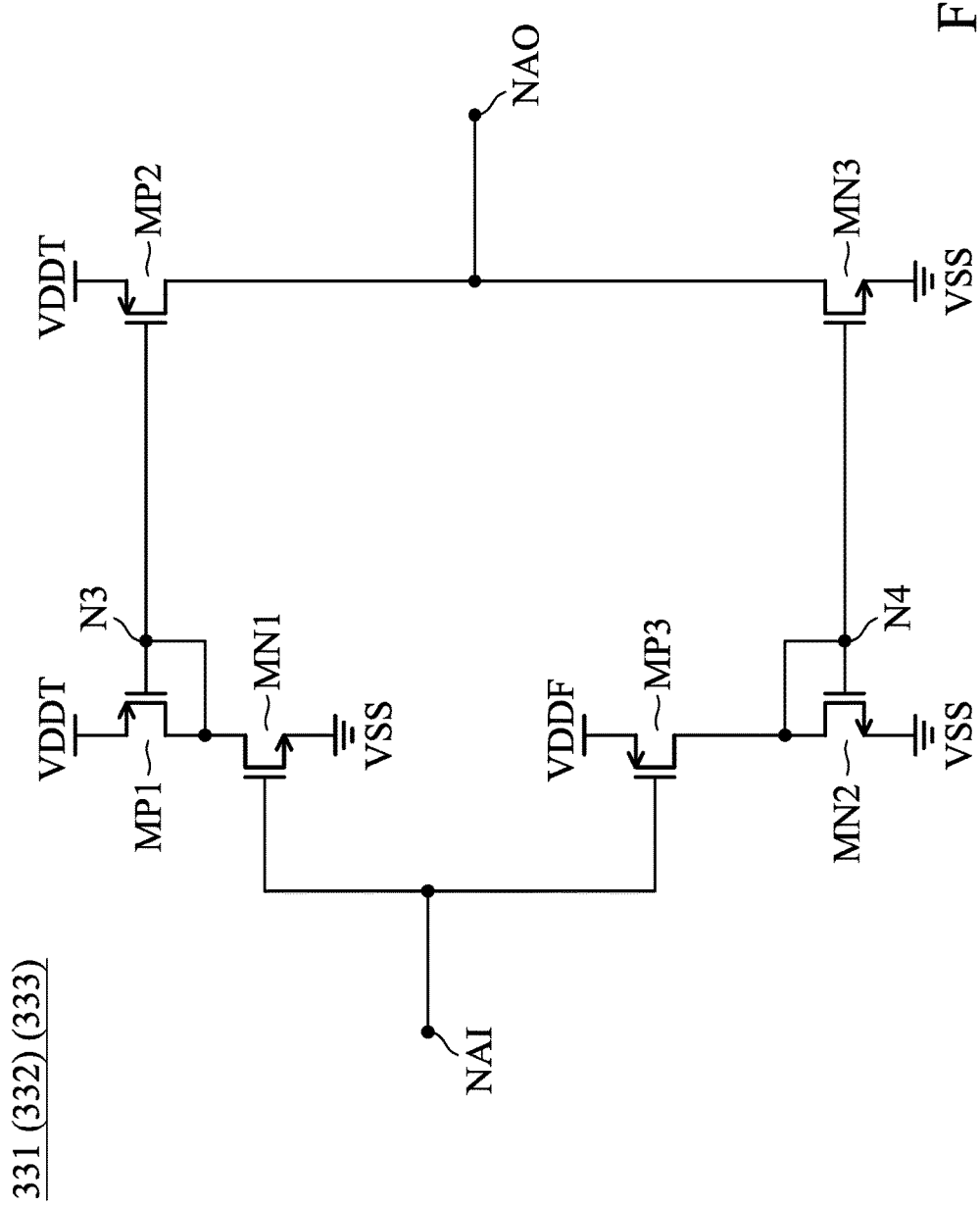
FIG. 4 is a diagram of an amplifier according to an embodiment of the invention.

FIG. 4 is a diagram of each of the first amplifier 331, the second amplifier 332, and the third amplifier 333 according to an embodiment of the invention. In the embodiment of FIG. 4, each of the first amplifier 331, the second amplifier 332, and the third amplifier 333 includes a first P-type transistor MP1, a second P-type transistor MP2, a third P-type transistor MP3, a first N-type transistor MN1, a second N-type transistor MN2, and a third N-type transistor MN3. For example, each P-type transistor may be a PMOS transistor (P-type Metal Oxide Semiconductor Field Effect Transistor), and each N-type transistor may be an NMOS transistor (N-type Metal Oxide Semiconductor Field Effect Transistor). The first N-type transistor MN1 has a control terminal coupled to an amplifier input node NAI, a first terminal coupled to the ground voltage VSS, and a second terminal coupled to a third node N3. For the first amplifier 331, the amplifier input node NAI is arranged for receiving the output signal SOUT; for the second amplifier 332, the amplifier input node NAI is arranged for receiving the first signal S1; for the third amplifier 333, the amplifier input node NAI is arranged for receiving the second signal S2. The first P-type transistor MP1 has a control terminal coupled to the third node N3, a first terminal coupled to the tunable supply voltage VDDT, and a second terminal coupled to the third node N3. The second P-type transistor MP2 has a control terminal coupled to the third node N3, a first terminal coupled to the tunable supply voltage VDDT, and a second terminal coupled to an amplifier output node NAO. For the first amplifier 331, the amplifier output node NAO is arranged for outputting the first amplified signal SA1; for the second amplifier 332, the amplifier output node NAO is arranged for outputting the second amplified signal SA2; for the third amplifier 333, the amplifier output node NAO is arranged for outputting the third amplified signal SA3. A first current mirror is formed by the first P-type transistor MP1 and the second P-type transistor MP2. The third P-type transistor MP3 has a control terminal coupled to the amplifier input node NAI, a first terminal coupled to the fixed supply voltage VDDF, and a second terminal coupled to a fourth node N4. The second N-type transistor MN2 has a control terminal coupled to the fourth node N4, a first terminal coupled to the ground voltage VSS, and a second terminal coupled to the fourth node N4. The third N-type transistor MN3 has a control terminal coupled to the fourth node N4, a first terminal coupled to the ground voltage VSS, and a second terminal coupled to the amplifier output node NAO. A second current mirror is formed by the second N-type transistor MN2 and the third N-type transistor MN3.

In the embodiment of FIG. 4, the gain factor K of each of the first amplifier 331, the second amplifier 332, and the third amplifier 333 is calculated according to the ratio of the tunable supply voltage VDDT to the fixed supply voltage VDDF. For example, if the tunable supply voltage VDDT is equal to 2V and the fixed supply voltage VDDF is equal to 1V, the gain factor K will be $$2\left(\frac{2\,V}{1\,V}=2\right),$$

but it is not limited thereto. The gain factor K of each of the first amplifier 331, the second amplifier 332, and the third amplifier 333 may be easily adjusted by controlling the tunable supply voltage VDDT. In some embodiments, the fixed supply voltage VDDF is the same as a high voltage level of each of the first signal S1, the second signal S2, and the output signal SOUT. In some embodiments, the fixed supply voltage VDDF is substantially equal to 1V.

In some embodiments, the ring oscillator 300 further includes a regulator 340. The regulator 340 is supplied by an independent supply voltage VDDE, and is configured to generate the tunable supply voltage VDDT. The tunable supply voltage VDDT may be determined according to a reference voltage VREF. For example, the tunable supply voltage VDDT may be substantially equal to the reference voltage VREF, but it is not limited thereto. The regulator 340 can provide the tunable supply voltage VDDT with a stronger driving capability, so as to drive the first amplifier 331, the second amplifier 332, and the third amplifier 333.

Figure 5:
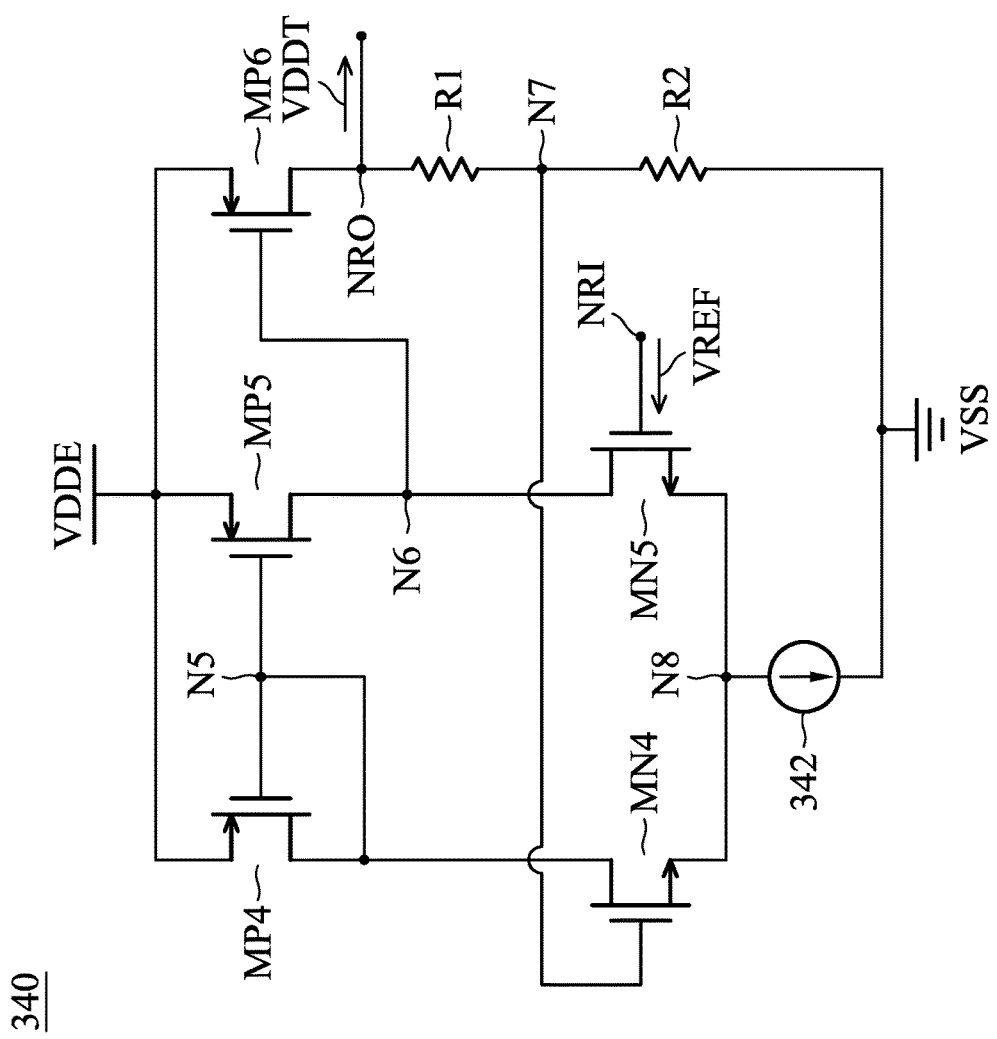
FIG. 5 is a diagram of a regulator according to an embodiment of the invention.

FIG. 5 is a diagram of the regulator 340 according to an embodiment of the invention. In the embodiment of FIG. 5, the regulator 340 includes a fourth P-type transistor MP4, a fifth P-type transistor MP5, a sixth P-type transistor MP6, a fourth N-type transistor MN4, a fifth N-type transistor MN5, a first resistor R1, a second resistor R2, and an independent current sink 342. For example, each P-type transistor may be a PMOS transistor (P-type Metal Oxide Semiconductor Field Effect Transistor), and each N-type transistor may be an NMOS transistor (N-type Metal Oxide Semiconductor Field Effect Transistor). The fourth P-type transistor MP4 has a control terminal coupled to a fifth node N5, a first terminal coupled to the independent supply voltage VDDE, and a second terminal coupled to the fifth node N5. The independent supply voltage VDDE may be from any voltage source, such as a 3V DC (Direct Current) voltage source. The fifth P-type transistor MP5 has a control terminal coupled to the fifth node N5, a first terminal coupled to the independent supply voltage VDDE, and a second terminal coupled to a sixth node N6. The sixth P-type transistor MP6 has a control terminal coupled to the sixth node N6, a first terminal coupled to the independent supply voltage VDDE, and a second terminal coupled to a regulator output node NRO. The regulator output node NRO is arranged for outputting the tunable supply voltage VDDT. The fourth N-type transistor MN4 has a control terminal coupled to a seventh node N7, a first terminal coupled to an eighth node N8, and a second terminal coupled to the fifth node N5. The fifth N-type transistor MN5 has a control terminal coupled to a regulator input node NRI, a first terminal coupled to the eighth node N8, and a second terminal coupled to the sixth node N6. The regulator input node NRI is arranged for receiving the reference voltage VREF. The independent current sink 342 draws a current from the eighth node N8 to the ground voltage VSS. The first resistor R1 has a first terminal coupled to the regulator output node NRO, and a second terminal coupled to the seventh node N7. The second resistor R2 has a first terminal coupled to the seventh node N7, and a second terminal coupled to the ground voltage VSS.

Sometimes, only the fixed supply voltage VDDF is available as a voltage source, and the independent supply voltage VDDE is not available. In some embodiments, the ring oscillator 300 further includes a voltage simulator 350. The voltage simulator 350 can use the fixed supply voltage VDDF to simulate and generate the independent supply voltage VDDE. The independent supply voltage VDDE may be higher than the fixed supply voltage VDDF. For example, the independent supply voltage VDDE may be 3V, and the fixed supply voltage VDDF may be 1V, but it is not limited thereto. Accordingly, the ring oscillator 300 can be applied to the circuitry having a single voltage source, without affecting the performance of the invention.

Figure 6:
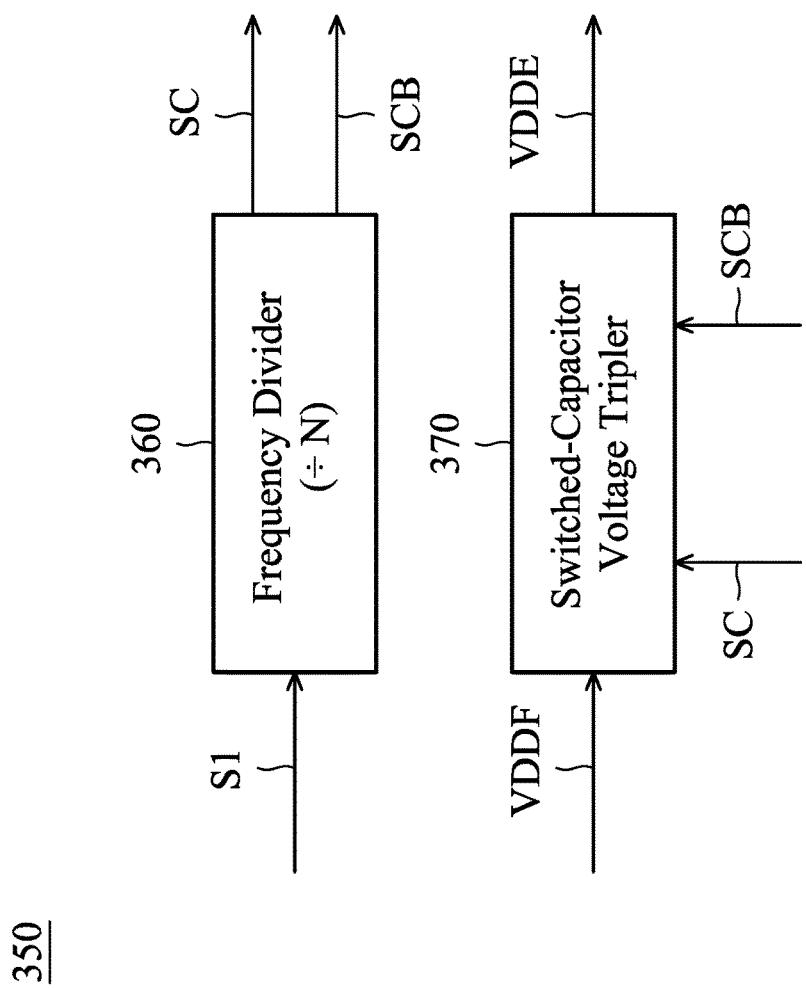
FIG. 6 is a diagram of a voltage simulator according to an embodiment of the invention.

FIG. 6 is a diagram of the voltage simulator 350 according to an embodiment of the invention. In the embodiment of FIG. 6, the voltage simulator 350 includes a frequency divider 360 and a switched-capacitor voltage tripler 370. The frequency divider 360 divides the oscillation frequency of the first signal S1 by a division factor N, so as to generate a control signal SC and an inverted control signal SCB. The logic level of the inverted control signal SCB is complementary to that of the control signal SC. The switched-capacitor voltage tripler 370 processes the fixed supply voltage VDDF, and generates the independent supply voltage VDDE according to the control signal SC and the inverted control signal SCB. The independent supply voltage VDDE may be substantially three times the fixed supply voltage VDDF. The relationship between the above signals may be described by the following equations (9), (10), and (11).

$$F_{SC} = \frac{F_{S1}}{N} \tag{9}$$

$$F_{SCB} = \frac{F_{S1}}{N} \tag{10}$$

$$VDDE = 3 \cdot VDDF \tag{11}$$

where "$F_{SC}$" represents the oscillation frequency of the control signal SC, "$F_{SCB}$" represents the oscillation frequency of the inverted control signal SCB, "$F_{S1}$" represents the oscillation frequency of the first signal S1, "N" represents the division factor N of the frequency divider 360, "VDDE" represents the voltage level of the independent supply voltage VDDE, and "VDDF" represents the voltage level of the fixed supply voltage VDDF.

Since the oscillation frequency of the first signal S1 may be too high, the frequency divider 360 can decrease the oscillation frequency of each of the control signal SC and the inverted control signal SCB, so as to control the switched-capacitor voltage tripler 370. According to practical implementations, the oscillation frequency of each of the control signal SC and the inverted control signal SCB should be lower than or equal to 10 MHz. For example, if the oscillation frequency of the first signal S1 is 6 GHz, the division factor N of the frequency divider 360 will be set to at least 600. It should be noted that the division factor N is adjustable to meet different requirements. In alternative embodiments, the first signal S1 input to the frequency divider 360 is replaced with the second signal S2 or the output signal SOUT, without affecting the performance of the invention. Typical structures of frequency divider circuits are well known to those skilled in the art and are not repeated here.

Figure 7:
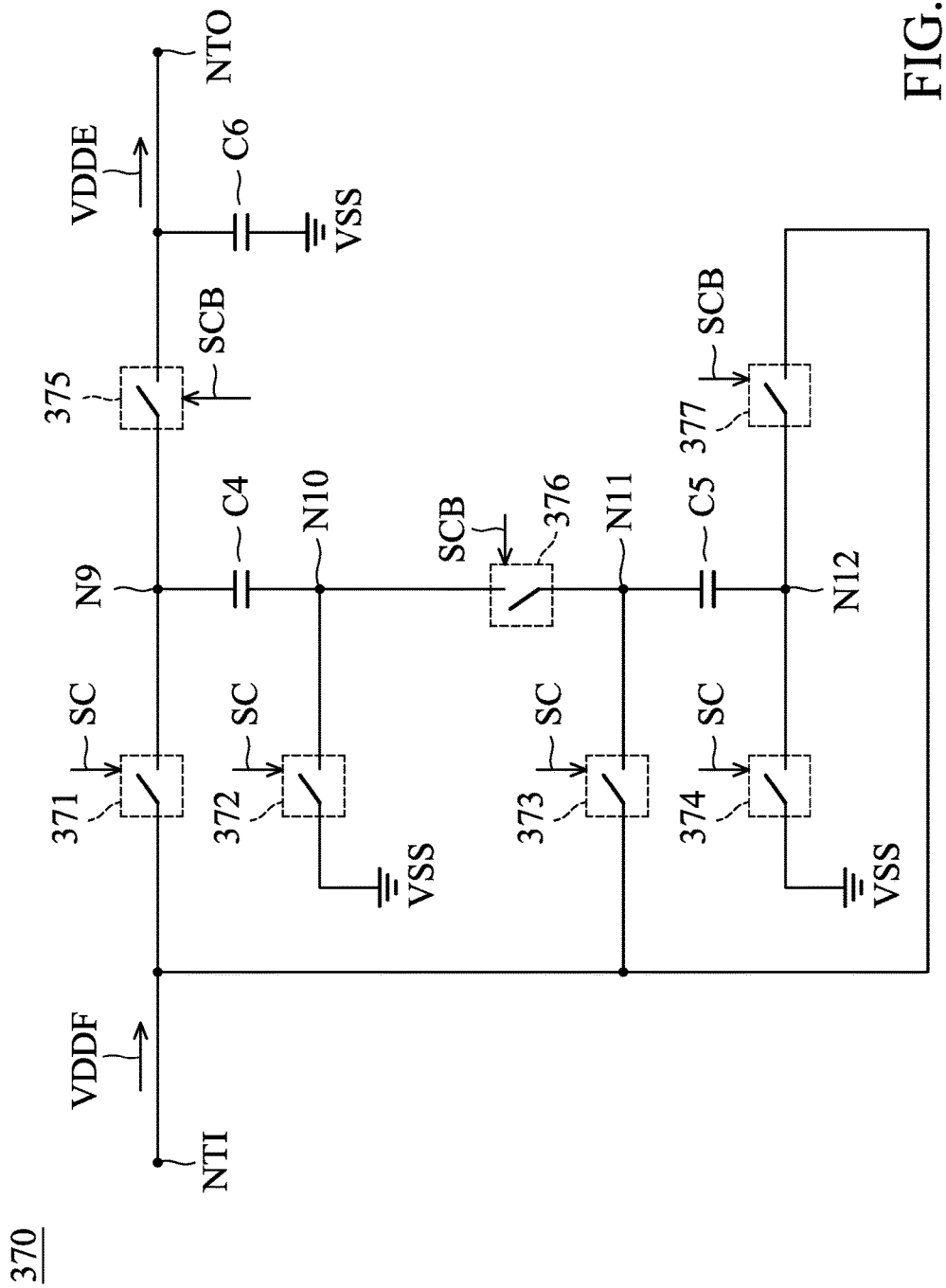
FIG. 7 is a diagram of a switched-capacitor voltage tripler according to an embodiment of the invention.

FIG. 7 is a diagram of the switched-capacitor voltage tripler 370 according to an embodiment of the invention. In the embodiment of FIG. 7, the switched-capacitor voltage tripler 370 includes a first switch element 371, a second switch element 372, a third switch element 373, a fourth switch element 374, a fifth switch element 375, a sixth switch element 376, a seventh switch element 377, a fourth capacitor C4, a fifth capacitor C5, and a sixth capacitor C6. The first switch element 371, the second switch element 372, the third switch element 373, and the fourth switch element 374 are selectively closed (i.e. conducting) or opened (i.e. not conducting) according to the control signal SC. For example, if the control signal SC has a high logic level, the first switch element 371, the second switch element 372, the third switch element 373, and the fourth switch element 374 will be all closed; conversely, if the control signal SC has a low logic level, the first switch element 371, the second switch element 372, the third switch element 373, and the fourth switch element 374 will be all opened. The fifth switch element 375, the sixth switch element 376, and the seventh switch element 377 are selectively closed or opened according to the inverted control signal SCB. For example, if the inverted control signal SCB has a high logic level, the fifth switch element 375, the sixth switch element 376, and the seventh switch element 377 will be all closed; conversely, if the inverted control signal SCB has a low logic level, the fifth switch element 375, the sixth switch element 376, and the seventh switch element 377 will be all opened.

The first switch element 371 has a first terminal coupled to a tripler input node NTI, and a second terminal coupled to a ninth node N9. The tripler input node NTI is arranged for receiving the fixed supply voltage VDDF. The fourth capacitor C4 has a first terminal coupled to the ninth node N9, and a second terminal coupled to a tenth node N10. The second switch element 372 has a first terminal coupled to the ground voltage VSS, and a second terminal coupled to the tenth node N10. The third switch element 373 has a first terminal coupled to the tripler input node NTI, and a second terminal coupled to an eleventh node N11. The fifth capacitor C5 has a first terminal coupled to the eleventh node N11, and a second terminal coupled to a twelfth node N12. The fourth switch element 374 has a first terminal coupled to the ground voltage VSS, and a second terminal coupled to the twelfth node N12. The fifth switch element 375 has a first terminal coupled to the ninth node N9, and a second terminal coupled to a tripler output node NTO. The tripler output node NTO is arranged for outputting the independent supply voltage VDDE. The sixth capacitor C6 has a first terminal coupled to the tripler output node NTO, and a second terminal coupled to the ground voltage VSS. The sixth switch element 376 has a first terminal coupled to the tenth node N10, and a second terminal coupled to the eleventh node N11. The seventh switch element 377 has a first terminal coupled to the twelfth node N12, and a second terminal coupled to the tripler input node NTI.

The switched-capacitor voltage tripler 370 may be operated as follows. When the control signal SC rises to a high logic level and the inverted control signal SCB falls to a low logic level, only the first switch element 371, the second switch element 372, the third switch element 373, and the fourth switch element 374 are closed, and the other switch elements are opened, such that the fourth capacitor C4 and the fifth capacitor C5 are charged for storing a voltage difference equal to the fixed supply voltage VDDF. Subsequently, when the inverted control signal SCB rises to the high logic level and the control signal SC falls to the low logic level, only the fifth switch element 375, the sixth switch element 376, and the seventh switch element 377 are closed, and the other switch elements are opened, such that the voltage level at the ninth node N9 and the tripler output node NTO becomes VDDF (voltage level at the twelfth node N12)+VDDF (voltage difference across the fifth capacitor C5)+VDDF (voltage difference across the fourth capacitor C4)=3×VDDF, and the independent supply voltage VDDE thus reaches three times the fixed supply voltage VDDF. The sixth capacitor C6 maintains the voltage level of the independent supply voltage VDDE during intervals when the fifth switch element 375 is opened (i.e., when the control signal SC is at a high logic level).

Figure 8:
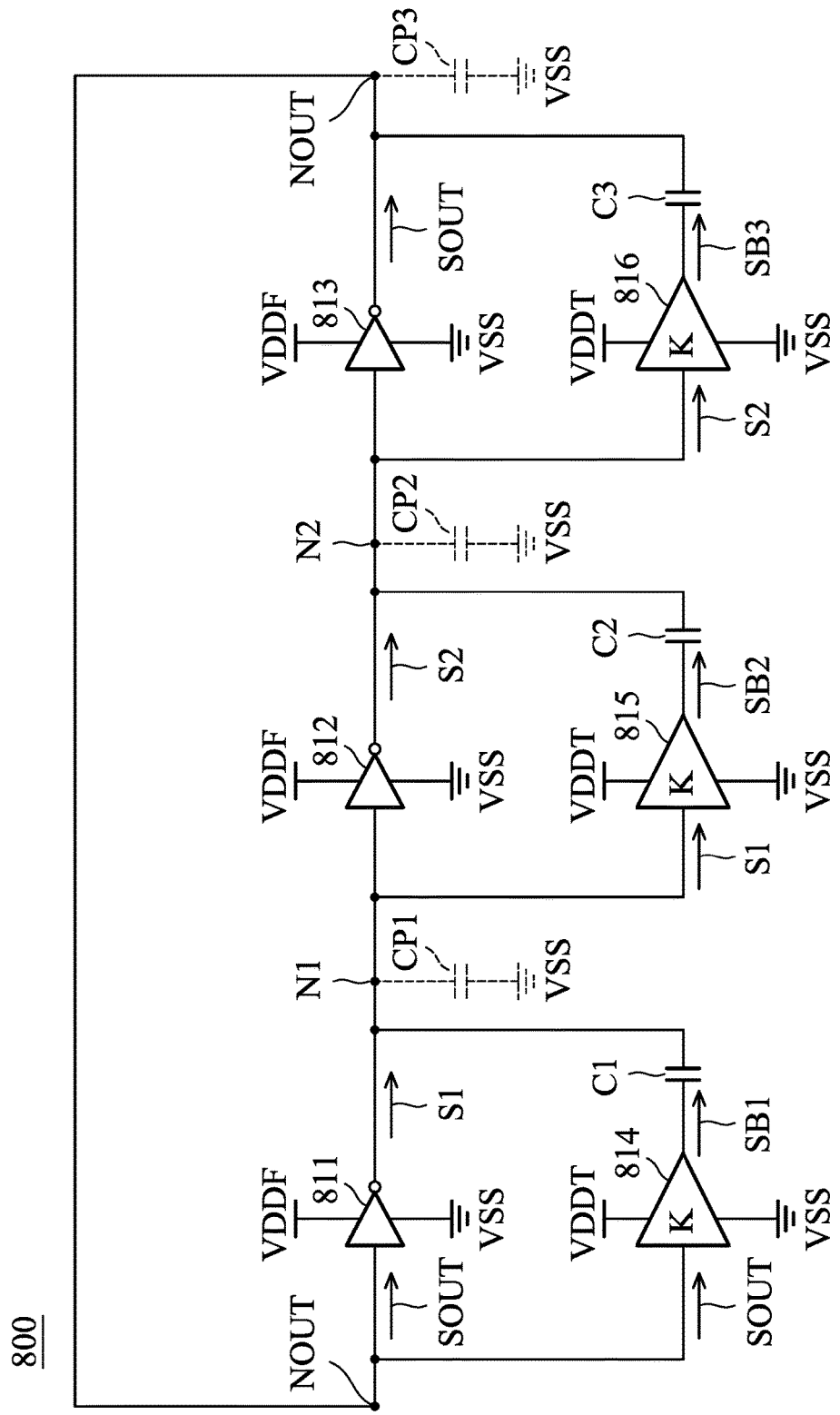
FIG. 8 is a diagram of a ring oscillator according to another embodiment of the invention.

FIG. 8 is a diagram of a ring oscillator 800 according to another embodiment of the invention. FIG. 8 is similar to FIG. 3. The difference between the two embodiments is that the ring oscillator 800 of FIG. 8 uses different configurations to couple the three amplifiers with the three inverters and three capacitors. In the embodiment of FIG. 8, the ring oscillator 800 with an output node NOUT includes a first inverter 811, a second inverter 812, a third inverter 813, a first amplifier 814, a second amplifier 815, a third amplifier 816, a first capacitor C1, a second capacitor C2, and a third capacitor C3. The output node NOUT of the ring oscillator 800 is arranged for outputting an output signal SOUT, so as to drive a subsequent stage. The output signal SOUT may be a clock signal. The first inverter 811, the second inverter 812, and the third inverter 813 are supplied by a fixed supply voltage VDDF. The first amplifier 814, the second amplifier 815, and the third amplifier 816 are supplied by a tunable supply voltage VDDT. The tunable supply voltage VDDT may be higher than the fixed supply voltage VDDF. The first inverter 811 has an input terminal coupled to the output node NOUT for receiving the output signal SOUT, and an output terminal for outputting a first signal S1 at a first node N1. The second inverter 812 has an input terminal coupled to the first node N1 for receiving the first signal S1, and an output terminal for outputting a second signal S2 at a second node N2. The third inverter 813 has an input terminal coupled to the second node N2 for receiving the second signal S2, and an output terminal for outputting the output signal SOUT at the output node NOUT. The first amplifier 814 can amplify the output signal SOUT by a gain factor K, so as to generate a first amplified signal SB1. The second amplifier 815 can amplify the first signal S1 by the gain factor K, so as to generate a second amplified signal SB2. The third amplifier 816 can amplify the second signal S2 by the gain factor K, so as to generate a third amplified signal SB3. The first capacitor C1 has a first terminal coupled to the first node N1, and a second terminal for receiving the first amplified signal SB1. The second capacitor C2 has a first terminal coupled to the second node N2, and a second terminal for receiving the second amplified signal SB2. The third capacitor C3 has a first terminal coupled to the output node NOUT, and a second terminal for receiving the third amplified signal SB3.

In some embodiments, the first inverter 811, the second inverter 812, and the third inverter 813 are CMOS (Complementary Metal Oxide Semiconductor) inverters, each of which includes a P-type transistor and an N-type transistor coupled between the fixed supply voltage VDDF and a ground voltage VSS. In some embodiments, the first inverter 811, the second inverter 812, and the third inverter 813 have the same size (i.e., the aspect ratios (W/L) of the CMOS transistors), and therefore these inverters have the same capability for driving currents. In some embodiments, the fixed supply voltage VDDF is the same as a high voltage level of each of the first signal S1, the second signal S2, and the output signal SOUT. In some embodiments, the fixed supply voltage VDDF is substantially equal to 1V.

The total parasitic capacitance at the first node N1 is modeled as a first parasitic capacitor CP1. The total parasitic capacitance at the second node N2 is modeled as a second parasitic capacitor CP2. The total parasitic capacitance at the output node NOUT is modeled as a third parasitic capacitor CP3. For example, the capacitance of the first capacitor C1 may be substantially equal to the capacitance of the first parasitic capacitor CP1, the capacitance of the second capacitor C2 may be substantially equal to the capacitance of the second parasitic capacitor CP2, the capacitance of the third capacitor C3 may be substantially equal to the capacitance of the third parasitic capacitor CP3, and the tunable supply voltage VDDT may be substantially two times the fixed supply voltage VDDF, such that the first parasitic capacitor CP1 can be cancelled by the first capacitor C1, the second parasitic capacitor CP2 can be cancelled by the second capacitor C2, and the third parasitic capacitor CP3 can be cancelled by the third capacitor C3, using the aforementioned negative capacitance mechanism. Similar to the embodiment of FIG. 2, the parasitic capacitance between any two cascading inverters is considered and cancelled in the embodiment of FIG. 8. Such a design can further increase the oscillation frequency of the ring oscillator 800. It should be noted that the invention is not limited to the above. In one embodiment, the tunable supply voltage VDDT may be substantially from one to three times the fixed supply voltage VDDF. The output voltage level of each of the first amplifier 814, the second amplifier 815, and the third amplifier 816 may be determined and adjusted according to the tunable supply voltage VDDT. That is, the aforementioned negative capacitance mechanism may be tunable for a variety of circuit applications, so as to meet different requirements.

It should be understood that although there are exactly three inverters, three amplifiers, and three capacitors displayed in FIG. 8, the ring oscillator 800 may include more cascading circuit stages arranged in a similar way, without affecting the performance of the invention.

Figure 9:
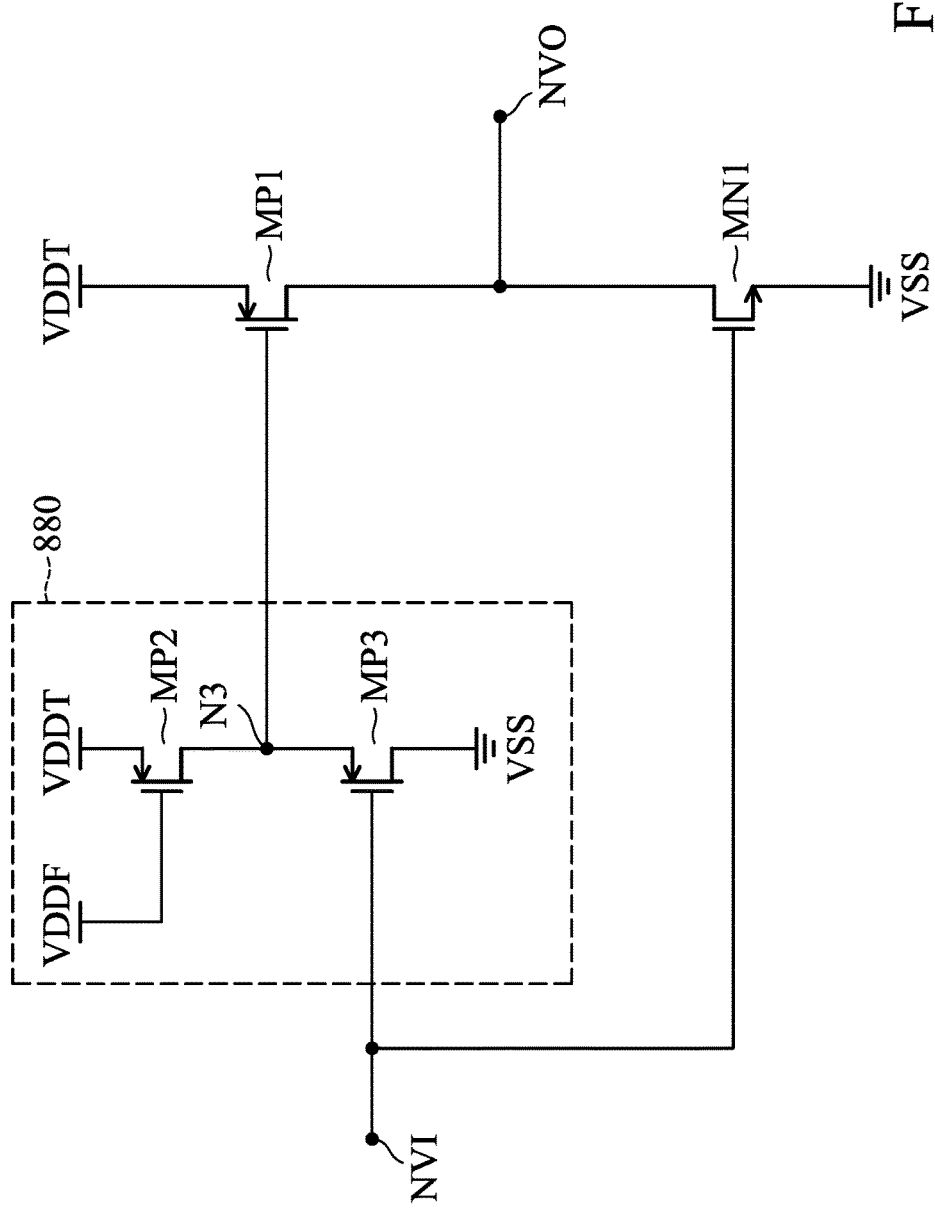
FIG. 9 is a diagram of an amplifier according to an embodiment of the invention.

FIG. 9 is a diagram of each of the first amplifier 814, the second amplifier 815, and the third amplifier 816 according to an embodiment of the invention. In the embodiment of FIG. 9, each of the first amplifier 814, the second amplifier 815, and the third amplifier 816 includes a first P-type transistor MP1, a second P-type transistor MP2, a third P-type transistor MP3, and a first N-type transistor MN1. For example, each P-type transistor may be a PMOS transistor (P-type Metal Oxide Semiconductor Field Effect Transistor), and each N-type transistor may be an NMOS transistor (N-type Metal Oxide Semiconductor Field Effect Transistor). The first P-type transistor MP1 has a control terminal coupled to a third node N3, a first terminal coupled to the tunable supply voltage VDDT, and a second terminal coupled to an amplifier output node NVO. For the first amplifier 814, the amplifier output node NVO is arranged for outputting the first amplified signal SB1; for the second amplifier 815, the amplifier output node NVO is arranged for outputting the second amplified signal SB2; for the third amplifier 816, the amplifier output node NVO is arranged for outputting the third amplified signal SB3. The first N-type transistor MN1 has a control terminal coupled to an amplifier input node NVI, a first terminal coupled to the ground voltage VSS, and a second terminal coupled to the amplifier output node NVO. For the first amplifier 814, the amplifier input node NVI is arranged for receiving the output signal SOUT; for the second amplifier 815, the amplifier input node NVI is arranged for receiving the first signal S1; for the third amplifier 816, the amplifier input node NVI is arranged for receiving the second signal S2. The second P-type transistor MP2 has a control terminal coupled to the fixed supply voltage VDDF, a first terminal coupled to the tunable supply voltage VDDT, and a second terminal coupled to the third node N3. The third P-type transistor MP3 has a control terminal coupled to the amplifier input node NVI, a first terminal coupled to the third node N3, and a second terminal coupled to the ground voltage VSS. A level shifter 880 is formed by the second P-type transistor MP2 and the third P-type transistor MP3. The level shifter 880 is coupled between the amplifier input node NVI and the third node N3, such that the voltage at the third node N3 is shifted higher than the voltage at the amplifier input node NVI. For example, the voltage at the amplifier input node NVI may be from 0V to 1V, and the voltage at the third node N3 may be from 1V to 2V, but it is not limited thereto. Similar to the embodiment of FIG. 4, the gain factor K of each of the first amplifier 814, the second amplifier 815, and the third amplifier 816 is calculated according to the ratio of the tunable supply voltage VDDT to the fixed supply voltage VDDF, and the gain factor K may be substantially equal to 2 in one embodiment.

The ring oscillator 800 uses the first amplifier 814, the second amplifier 815, and the third amplifier 816 each coupled in parallel with the first inverter 811, the second inverter 812, and the third inverter 813, respectively, instead of the configuration in FIG. 3 in above. Such a design can further improve the negative capacitance mechanism because the delay times of the first amplifier 814, the second amplifier 815, and the third amplifier 816 are more matched with the delay times of the first inverter 811, the second inverter 812, and the third inverter 813 than in the configuration in FIG. 3, in which the delay time of the amplifier of FIG. 4 is more difficult to be matched with the delay time of two inverters. If the delay times are not properly matched, the negative capacitance mechanism may not entirely cancel the parasitic capacitors. Specifically, the level shifter 880 is added in such a manner that the voltage at the control terminal of the first P-type transistor MP1 is shifted up, and it makes the gate-to-source voltage difference (i.e., Vgs) of the first P-type transistor MP1 equal to that of the corresponding P-type transistor of each of the first inverter 811, the second inverter 812, and the third inverter 813. In one embodiment, the aspect ratios of the first P-type transistor MP1 and the first N-type transistor MN1 of the amplifiers 814-816 are equal to those of the CMOS transistors of the inverters 811-813. Since the delay time is inversely proportional to the transistor current, which is in turn related to Vgs (dt=CdV/I; I∝(Vgs−Vt)^2), matching the aspect ratios and Vgs of MP1 and MN1 of the amplifiers 814-816 with those of the CMOS transistors of the inverters 811-813 may match their delay times. In addition, the level shifter 880 can eliminate a current leakage occurring in the first P-type transistor MP1, which may result from the voltage difference between the tunable supply voltage VDDT and the fixed supply voltage VDDF. Accordingly, signals passing through the first amplifier 814, the second amplifier 815, and the third amplifier 816 are almost synchronized with signals passing through the first inverter 811, the second inverter 812, and the third inverter 813 (i.e., the signals are in-phase with each other), and the oscillation frequency of the ring oscillator 800 is further increased.

It should be understood that the regulator 340 of FIG. 5 may be used to provide the tunable supply voltage VDDT, and the voltage simulator 350 of FIG. 6 and the switched-capacitor voltage tripler 370 of FIG. 7 may be used to provide the independent supply voltage VDDE for the ring oscillator 800 of FIG. 8, and they will not be illustrated again here.

The invention provides a novel ring oscillator with a very high oscillation frequency. In conclusion, the proposed design has at least the following advantages over the prior art: (1) compensating for non-ideal parasitic capacitance with a negative capacitance mechanism, (2) covering a wide frequency range, (3) providing a high transmission and operation speed of circuitry, and (4) being more insensitive to PVT (Process, Voltage, and Temperature) variations. According to simulation, the oscillation frequency of the ring oscillators 300 and 800 using the negative capacitance mechanism can be significantly improved from 6 GHz to 60

GHz (almost 10 times faster), and it is suitable for application in a variety of circuit designs.

Note that the above voltages, currents, resistances, inductances, capacitances and other element parameters are not limitations of the invention. A designer can adjust these parameters according to different requirements. The ring oscillator of the invention is not limited to the configurations of FIGS. 1-9. The invention may merely include any one or more features of any one or more embodiments of FIGS. 1-9. In other words, not all of the features displayed in the figures should be implemented in the ring oscillator of the invention. Although the embodiments of the invention use MOSFETs as examples, the invention is not limited thereto, and those skilled in the art may use other types of transistors such as BJT (Bipolar Junction Transistors), JFET (Junction Gate Field Effect Transistor), FinFET (Fin Field Effect Transistor), etc.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered exemplary only, with the true scope of the disclosed embodiments being indicated by the following claims and their equivalents.

What is claimed is:

1. A ring oscillator, comprising:
   a first inverter, wherein the first inverter has an input terminal for receiving an output signal, and an output terminal for outputting a first signal at a first node;
   a second inverter, wherein the second inverter has an input terminal for receiving the first signal, and an output terminal for outputting a second signal at a second node;
   a third inverter, wherein the third inverter has an input terminal for receiving the second signal, and an output terminal for outputting the output signal at an output node of the ring oscillator;
   a first amplifier, amplifying the output signal by a gain factor so as to generate a first amplified signal;
   a second amplifier, amplifying the first signal by the gain factor so as to generate a second amplified signal;
   a third amplifier, amplifying the second signal by the gain factor so as to generate a third amplified signal;
   a first capacitor, wherein the first capacitor has a first terminal coupled to the first node, and a second terminal for receiving the third amplified signal;
   a second capacitor, wherein the second capacitor has a first terminal coupled to the second node, and a second terminal for receiving the first amplified signal; and
   a third capacitor, wherein the third capacitor has a first terminal coupled to the output node, and a second terminal for receiving the second amplified signal.

2. The ring oscillator as claimed in claim 1, wherein a capacitance of the first capacitor is substantially equal to a total parasitic capacitance at the first node, wherein a capacitance of the second capacitor is substantially equal to a total parasitic capacitance at the second node, and wherein a capacitance of the third capacitor is substantially equal to a total parasitic capacitance at the output node.

3. The ring oscillator as claimed in claim 1, wherein the gain factor is substantially equal to 2.

4. The ring oscillator as claimed in claim 1, wherein the first amplifier, the second amplifier, and the third amplifier are supplied by a tunable supply voltage and a fixed supply voltage, and wherein the gain factor is determined according to the tunable supply voltage.

5. The ring oscillator as claimed in claim 4, wherein each of the first amplifier, the second amplifier, and the third amplifier comprises:
   a first N-type transistor, wherein the first N-type transistor has a control terminal coupled to an amplifier input node, a first terminal coupled to a ground voltage, and a second terminal coupled to a third node, and wherein the amplifier input node is arranged for receiving the output signal, the first signal, or the second signal;
   a first P-type transistor, wherein the first P-type transistor has a control terminal coupled to the third node, a first terminal coupled to the tunable supply voltage, and a second terminal coupled to the third node;
   a second P-type transistor, wherein the second P-type transistor has a control terminal coupled to the third node, a first terminal coupled to the tunable supply voltage, and a second terminal coupled to an amplifier output node, and wherein the amplifier output node is arranged for outputting the first amplified signal, the second amplified signal, or the third amplified signal;
   a third P-type transistor, wherein the third P-type transistor has a control terminal coupled to the amplifier input node, a first terminal coupled to the fixed supply voltage, and a second terminal coupled to a fourth node;
   a second N-type transistor, wherein the second N-type transistor has a control terminal coupled to the fourth node, a first terminal coupled to the ground voltage, and a second terminal coupled to the fourth node; and
   a third N-type transistor, wherein the third N-type transistor has a control terminal coupled to the fourth node, a first terminal coupled to the ground voltage, and a second terminal coupled to the amplifier output node.

6. The ring oscillator as claimed in claim 4, further comprising:
   a regulator, supplied by an independent supply voltage, wherein the regulator generates the tunable supply voltage which is determined according to a reference voltage.

7. The ring oscillator as claimed in claim 6, wherein the regulator comprises:
   a fourth P-type transistor, wherein the fourth P-type transistor has a control terminal coupled to a fifth node, a first terminal coupled to the independent supply voltage, and a second terminal coupled to the fifth node;
   a fifth P-type transistor, wherein the fifth P-type transistor has a control terminal coupled to the fifth node, a first terminal coupled to the independent supply voltage, and a second terminal coupled to a sixth node;
   a sixth P-type transistor, wherein the sixth P-type transistor has a control terminal coupled to the sixth node, a first terminal coupled to the independent supply voltage, and a second terminal coupled to a regulator output node, and wherein the regulator output node is arranged for outputting the tunable supply voltage;
   a fourth N-type transistor, wherein the fourth N-type transistor has a control terminal coupled to a seventh node, a first terminal coupled to an eighth node, and a second terminal coupled to the fifth node;

a fifth N-type transistor, wherein the fifth N-type transistor has a control terminal coupled to a regulator input node, a first terminal coupled to the eighth node, and a second terminal coupled to the sixth node, and wherein the regulator input node is arranged for receiving the reference voltage;

an independent current sink, drawing a current from the eighth node to a ground voltage;

a first resistor, wherein the first resistor has a first terminal coupled to the regulator output node, and a second terminal coupled to the seventh node; and a second resistor, wherein the second resistor has a first terminal coupled to the seventh node, and a second terminal coupled to the ground voltage.

8. The ring oscillator as claimed in claim 6, further comprising:

a voltage simulator, using the fixed supply voltage and one of the first signal, the second signal, and the output signal to generate the independent supply voltage, wherein the independent supply voltage is higher than the fixed supply voltage.

9. The ring oscillator as claimed in claim 8, wherein the voltage simulator comprises:

a frequency divider, dividing a frequency of one of the first signal, the second signal, and the output signal by a division factor so as to generate a control signal and an inverted control signal; and a switched-capacitor voltage tripler, generating the independent supply voltage according to the fixed supply voltage and the control signal and the inverted control signal, wherein the independent supply voltage is substantially three times the fixed supply voltage.

10. The ring oscillator as claimed in claim 9, wherein the switched-capacitor voltage tripler comprises:

a first switch element, selectively closed or opened according to the control signal, wherein the first switch element has a first terminal coupled to a tripler input node, and a second terminal coupled to a ninth node, wherein the tripler input node is arranged for receiving the fixed supply voltage;

a fourth capacitor, wherein the fourth capacitor has a first terminal coupled to the ninth node, and a second terminal coupled to a tenth node;

a second switch element, selectively closed or opened according to the control signal, wherein the second switch element has a first terminal coupled to a ground voltage, and a second terminal coupled to the tenth node;

a third switch element, selectively closed or opened according to the control signal, wherein the third switch element has a first terminal coupled to the tripler input node, and a second terminal coupled to an eleventh node;

a fifth capacitor, wherein the fifth capacitor has a first terminal coupled to the eleventh node, and a second terminal coupled to a twelfth node;

a fourth switch element, selectively closed or opened according to the control signal, wherein the fourth switch element has a first terminal coupled to the ground voltage, and a second terminal coupled to the twelfth node;

a fifth switch element, selectively closed or opened according to the inverted control signal, wherein the fifth switch element has a first terminal coupled to the ninth node, and a second terminal coupled to a tripler output node, wherein the tripler output node is arranged for outputting the independent supply voltage;

a sixth capacitor, wherein the sixth capacitor has a first terminal coupled to the tripler output node, and a second terminal coupled to the ground voltage;

a sixth switch element, selectively closed or opened according to the inverted control signal, wherein the sixth switch element has a first terminal coupled to the tenth node, and a second terminal coupled to the eleventh node; and a seventh switch element, selectively closed or opened according to the inverted control signal, wherein the seventh switch element has a first terminal coupled to the twelfth node, and a second terminal coupled to the tripler input node.

11. A ring oscillator, comprising:

a first inverter, wherein the first inverter has an input terminal for receiving an output signal, and an output terminal for outputting a first signal at a first node;

a second inverter, wherein the second inverter has an input terminal for receiving the first signal, and an output terminal for outputting a second signal at a second node;

a third inverter, wherein the third inverter has an input terminal for receiving the second signal, and an output terminal for outputting the output signal at an output node of the ring oscillator;

a first amplifier, amplifying the output signal by a gain factor so as to generate a first amplified signal;

a second amplifier, amplifying the first signal by the gain factor so as to generate a second amplified signal;

a third amplifier, amplifying the second signal by the gain factor so as to generate a third amplified signal;

a first capacitor, wherein the first capacitor has a first terminal coupled to the first node, and a second terminal for receiving the first amplified signal;

a second capacitor, wherein the second capacitor has a first terminal coupled to the second node, and a second terminal for receiving the second amplified signal; and a third capacitor, wherein the third capacitor has a first terminal coupled to the output node, and a second terminal for receiving the third amplified signal.

12. The ring oscillator as claimed in claim 11, wherein a capacitance of the first capacitor is substantially equal to a total parasitic capacitance at the first node, wherein a capacitance of the second capacitor is substantially equal to a total parasitic capacitance at the second node, and wherein a capacitance of the third capacitor is substantially equal to a total parasitic capacitance at the output node.

13. The ring oscillator as claimed in claim 11, wherein the first inverter, the second inverter, and the third inverter are supplied by a fixed supply voltage, wherein the first amplifier, the second amplifier, and the third amplifier are supplied by a tunable supply voltage, and wherein the gain factor is determined according to the tunable supply voltage.

14. The ring oscillator as claimed in claim 13, wherein each of the first amplifier, the second amplifier, and the third amplifier comprises:

a first P-type transistor, wherein the first P-type transistor has a control terminal coupled to a third node, a first terminal coupled to the tunable supply voltage, and a second terminal coupled to an amplifier output node, wherein the amplifier output node is arranged for outputting the first amplified signal, the second amplified signal, or the third amplified signal;

a first N-type transistor, wherein the first N-type transistor has a control terminal coupled to an amplifier input node, a first terminal coupled to a ground voltage, and a second terminal coupled to the amplifier output node, wherein the amplifier input node is arranged for receiving the output signal, the first signal, or the second signal; and a level shifter, coupled between the amplifier input node and the third node, such that a voltage at the third node is higher than a voltage at the amplifier input node.

15. The ring oscillator as claimed in claim 14, wherein the level shifter comprises:

a second P-type transistor, wherein the second P-type transistor has a control terminal coupled to the fixed supply voltage, a first terminal coupled to the tunable supply voltage, and a second terminal coupled to the third node; and a third P-type transistor, wherein the third P-type transistor has a control terminal coupled to the amplifier input node, a first terminal coupled to the third node, and a second terminal coupled to the ground voltage.

16. The ring oscillator as claimed in claim 13, further comprising:

a regulator, supplied by an independent supply voltage, wherein the regulator generates the tunable supply voltage which is determined according to a reference voltage.

17. The ring oscillator as claimed in claim 16, wherein the regulator comprises:

a fourth P-type transistor, wherein the fourth P-type transistor has a control terminal coupled to a fifth node, a first terminal coupled to the independent supply voltage, and a second terminal coupled to the fifth node;

a fifth P-type transistor, wherein the fifth P-type transistor has a control terminal coupled to the fifth node, a first terminal coupled to the independent supply voltage, and a second terminal coupled to a sixth node;

a sixth P-type transistor, wherein the sixth P-type transistor has a control terminal coupled to the sixth node, a first terminal coupled to the independent supply voltage, and a second terminal coupled to a regulator output node, and wherein the regulator output node is arranged for outputting the tunable supply voltage;

a fourth N-type transistor, wherein the fourth N-type transistor has a control terminal coupled to a seventh node, a first terminal coupled to an eighth node, and a second terminal coupled to the fifth node;

a fifth N-type transistor, wherein the fifth N-type transistor has a control terminal coupled to a regulator input node, a first terminal coupled to the eighth node, and a second terminal coupled to the sixth node, and wherein the regulator input node is arranged for receiving the reference voltage;

an independent current sink, drawing a current from the eighth node to a ground voltage;

a first resistor, wherein the first resistor has a first terminal coupled to the regulator output node, and a second terminal coupled to the seventh node; and a second resistor, wherein the second resistor has a first terminal coupled to the seventh node, and a second terminal coupled to the ground voltage.

18. The ring oscillator as claimed in claim 16, further comprising:

a voltage simulator, using the fixed supply voltage and one of the first signal, the second signal, and the output signal to generate the independent supply voltage, wherein the independent supply voltage is higher than the fixed supply voltage.

19. The ring oscillator as claimed in claim 18, wherein the voltage simulator comprises:

a frequency divider, dividing a frequency of one of the first signal, the second signal, and the output signal by a division factor so as to generate a control signal and an inverted control signal; and a switched-capacitor voltage tripler, generating the independent supply voltage according to the fixed supply voltage and the control signal and the inverted control signal, wherein the independent supply voltage is substantially three times the fixed supply voltage.

20. The ring oscillator as claimed in claim 19, wherein the switched-capacitor voltage tripler comprises:

a first switch element, selectively closed or opened according to the control signal, wherein the first switch element has a first terminal coupled to a tripler input node, and a second terminal coupled to a ninth node, wherein the tripler input node is arranged for receiving the fixed supply voltage;

a fourth capacitor, wherein the fourth capacitor has a first terminal coupled to the ninth node, and a second terminal coupled to a tenth node;

a second switch element, selectively closed or opened according to the control signal, wherein the second switch element has a first terminal coupled to a ground voltage, and a second terminal coupled to the tenth node;

a third switch element, selectively closed or opened according to the control signal, wherein the third switch element has a first terminal coupled to the tripler input node, and a second terminal coupled to an eleventh node;

a fifth capacitor, wherein the fifth capacitor has a first terminal coupled to the eleventh node, and a second terminal coupled to a twelfth node;

a fourth switch element, selectively closed or opened according to the control signal, wherein the fourth switch element has a first terminal coupled to the ground voltage, and a second terminal coupled to the twelfth node;

a fifth switch element, selectively closed or opened according to the inverted control signal, wherein the fifth switch element has a first terminal coupled to the ninth node, and a second terminal coupled to a tripler output node, wherein the tripler output node is arranged for outputting the independent supply voltage;

a sixth capacitor, wherein the fifth capacitor has a first terminal coupled to the tripler output node, and a second terminal coupled to the ground voltage;

a sixth switch element, selectively closed or opened according to the inverted control signal, wherein the sixth switch element has a first terminal coupled to the tenth node, and a second terminal coupled to the eleventh node; and a seventh switch element, selectively closed or opened according to the inverted control signal, wherein the seventh switch element has a first terminal coupled to the twelfth node, and a second terminal coupled to the tripler input node.

* * * * *